(12) United States Patent
Matsuo

(10) Patent No.: US 6,328,585 B1
(45) Date of Patent: Dec. 11, 2001

(54) ELECTRICAL CONNECTOR HAVING A CONTACT ELEMENT WITH LARGE FLEXIBILITY AND A SHORT TRANSMISSION PATH

(75) Inventor: Tsutomu Matsuo, Tokyo (JP)

(73) Assignee: Hirose Electric Co., Ltd., Tokyo (JP)

( * ) Notice: Subject to any disclaimer, the term of this patent is extended or adjusted under 35 U.S.C. 154(b) by 0 days.

(21) Appl. No.: 09/612,255

(22) Filed: Jul. 7, 2000

(30) Foreign Application Priority Data

Jul. 30, 1999 (JP) .................................................. 11-216304

(51) Int. Cl.⁷ ............................. H01R 4/50; H01R 13/625
(52) U.S. Cl. ............................................. 439/342; 439/856
(58) Field of Search .................................... 439/862, 342, 439/259, 876, 856

(56) References Cited

U.S. PATENT DOCUMENTS

| | | | | |
|---|---|---|---|---|
| 4,498,725 | * | 2/1985 | Bright et al. ........................ | 439/342 |
| 4,647,134 | * | 3/1987 | Nonaka ................................ | 439/342 |
| 5,443,591 | * | 8/1995 | Tsai ..................................... | 439/342 |
| 5,454,727 | * | 10/1995 | Hsu ..................................... | 439/342 |
| 5,569,045 | * | 10/1996 | Hsu ..................................... | 439/342 |
| 5,807,127 | * | 9/1998 | Ohshima ............................. | 439/342 |
| 6,074,233 | * | 6/2000 | Lin ...................................... | 439/342 |

* cited by examiner

Primary Examiner—Brian Sircus
Assistant Examiner—Hae Moon Hyeon
(74) Attorney, Agent, or Firm—Kanesaka & Takeuchi

(57) ABSTRACT

A contact element (3) comprises a base section (4) for attaching the contact element to a housing (1); a connection section (7) extending from the base section at a position; a first contact piece (6) extending from the base section at a first position to form a first contact portion (6A) at a free end; and a second contact piece (5) extending from the base section at a second position to form a second contact portion (5A) at a free end and successively bend in three dimensions.

3 Claims, 4 Drawing Sheets

ELECTRICAL CONNECTOR HAVING A CONTACT ELEMENT WITH LARGE FLEXIBILITY AND A SHORT TRANSMISSION PATH

BACKGROUND OF THE INVENTION

1. Field of the Invention

The present invention relates to contact elements for electrical connectors and electrical connectors having the same.

2. Related Art

Intermediate electrical connectors for connecting two connection objects or circuit boards are well known.

Japanese patent application Kokai No. 4-144083 discloses such a connector. As shown in FIG. 4, a housing 51 is provided with a comb-like guide 52 having a plurality of guide grooves 53 in which contact elements 54 are placed so as to be parallel to the faces of the guide grooves.

The contact elements 54 are stamped from sheet metal so as to have a U-shaped resilient section 55 with a contact portion 56 at a free end and a connection section 57 at the other end. The contact section 56 projects upwardly while the connection section 57 extends downwardly. Opposed edge portions 56A and 57A of the contact and connection sections 56 and 57, respectively, are curved in opposite directions to form contact points. The connection section 57 is connected to a circuit trace of a connection object (not shown) by soldering or the like.

In operation, another connection object (not shown) is pressed against the contact sections 56 to deform the U-shaped resilient sections 55, thereby bringing the opposed edge portions 56A and 57A into contact with each other under a predetermined pressure. Thus, the two connection objects are connected electrically.

However, when the contact points are closed, the spring constant of the resilient sections abruptly rises and the resilient sections are hardly deformed thereafter. Consequently, in order to provide a satisfactory contact area, it is necessary to apply a large force to the connection object.

Since the opposed edge portions of the contact and connection sections are curved in the opposite directions, if there are errors between the contact and connection sections in the thicknesswise direction, the above contact pressure varies with the contact elements. Consequently, poor or uneven contact is produced between the opposed edge portions.

In addition, there is frequently a short-circuit between the contact points of the contact element. In order to provide the resilient section with satisfactory resilience, the resilient sections are made so long that the terminal becomes long.

SUMMARY OF THE INVENTION

Accordingly, it is an object of the invention to provide an electrical connector capable of providing satisfactory resiliency and maintaining the resiliency after contact with the contact elements of a connection object without contact points.

Relative to the invention, a contact element for an electrical connector comprises a base section; and a connection section extending from said base section.

According to the invention, the contact element comprises a first contact piece extending from said base section at a first position and having a first contact portion at a free end thereof; and a second contact piece extending from said base section at a second position and successively bent in three dimensions to provide a second contact portion at a free end thereof which is flexible in said three dimensions.

Since the second contact piece is bent in three dimensions, the effective contact length is large for the small size to thereby assure satisfactory resilience. The contact portions of the first and second contact pieces hold the terminal of a mating connection object between them so that the resilience is maintained after contact. In addition, there is no conventional contact point within the contact element.

According to the invention, said second contact piece comprises a bearing face for abutment with a terminal of a mating connection object so that the insertion position of the terminal is determined automatically. The bearing face is spaced from the contact portions at right angles with an axis of the terminal of a mating connection object so that the terminal is put into the accommodation hole in the axial direction with no resistance and then moved laterally to the contact portions.

The contact portion of said first contact piece is in the same plane as and linked together with said connection section via a substantially straight transmission path so that the electrical resistance of the transmission path is so low that the electrical characteristics are improved.

Moreover, there is provided an electrical connector comprising a housing having a plate-like form in which at least one accommodation hole is provided; a contact element according the invention which is put in said accommodation hole such that said connection section project from a face of said housing and a terminal of a mating connection object is put into said accommodation hole through the other face of said housing for contact with said contact portions of said contact element.

DESCRIPTION OF THE PREFERRED EMBODIMENTS

Embodiments of the invention will now be described with reference to FIGS. 1–3.

Figure 1:
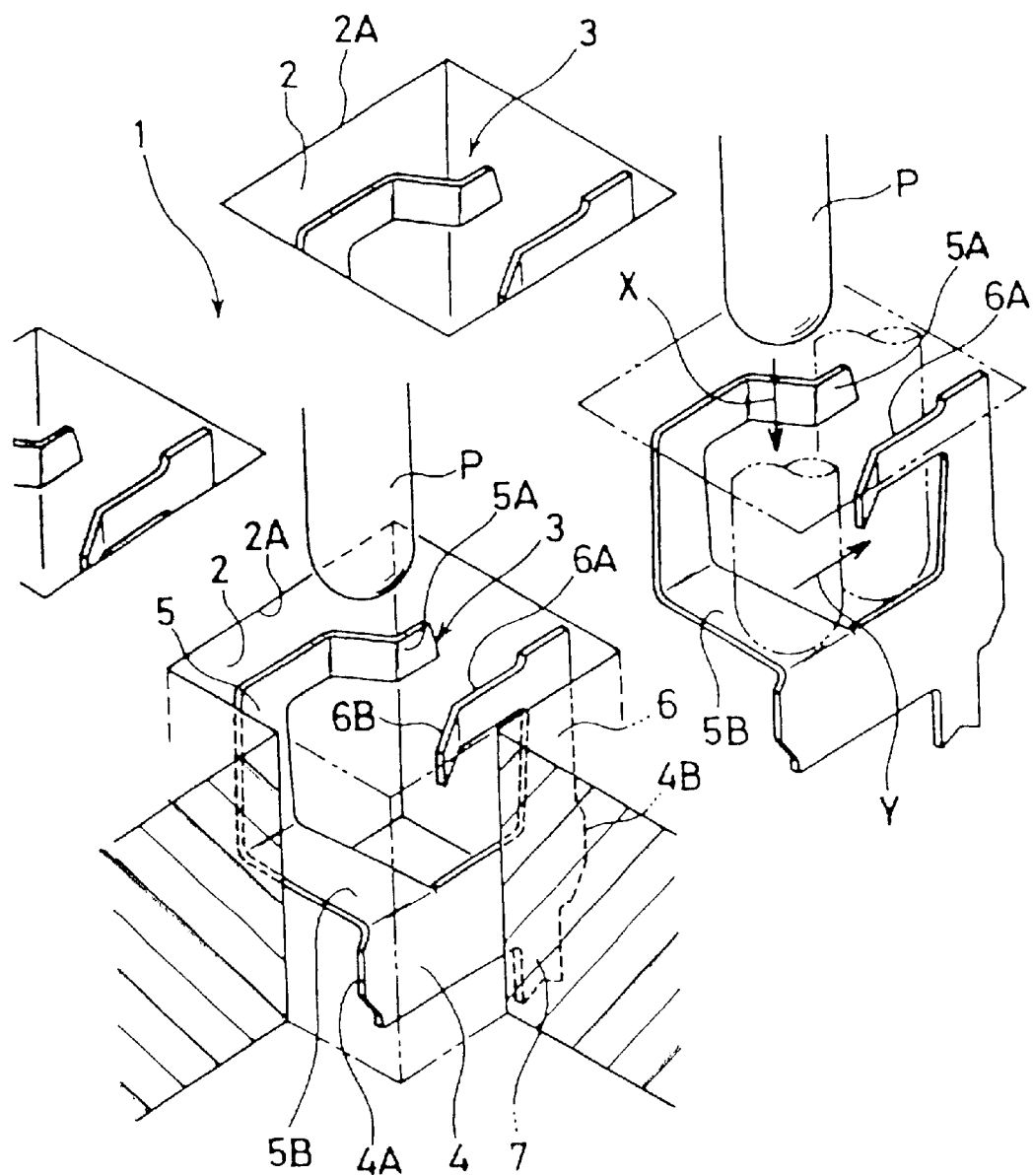
FIG. 1 is a perspective view, partially in section, of a connector according to an embodiment of the invention.

In FIG. 1, an intermediate connector 1 comprises a housing 1 made of a dielectric material, a plurality of accommodation holes 2 provided in the housing 1, and a plurality of contact elements 3.

The housing 1 has a plate-like form, in which the accommodation holes 2 are provided in rows and columns. Each accommodation hole 2 has an opening 2A in the top surface of the housing 1 to receive a pin-like terminal P of a mating connection object such as circuit board or connector.

Each contact element 3 is made by forming a metal sheet so as to have a base section 4, first and second contact pieces 5 and 6 extending upwardly from the base section 4, and a connection piece 7 extending downwardly from the base section 4. The first and second contact pieces 5 and 6 have contact portions 5A and 6A, respectively, which are opposed to each other at a predetermined distance so as to hold the terminal P between them. The connection piece 7 projects from the housing 1 and is connected by soldering or the like to the corresponding circuit trace of a mating connection object (not shown).

Figure 2:
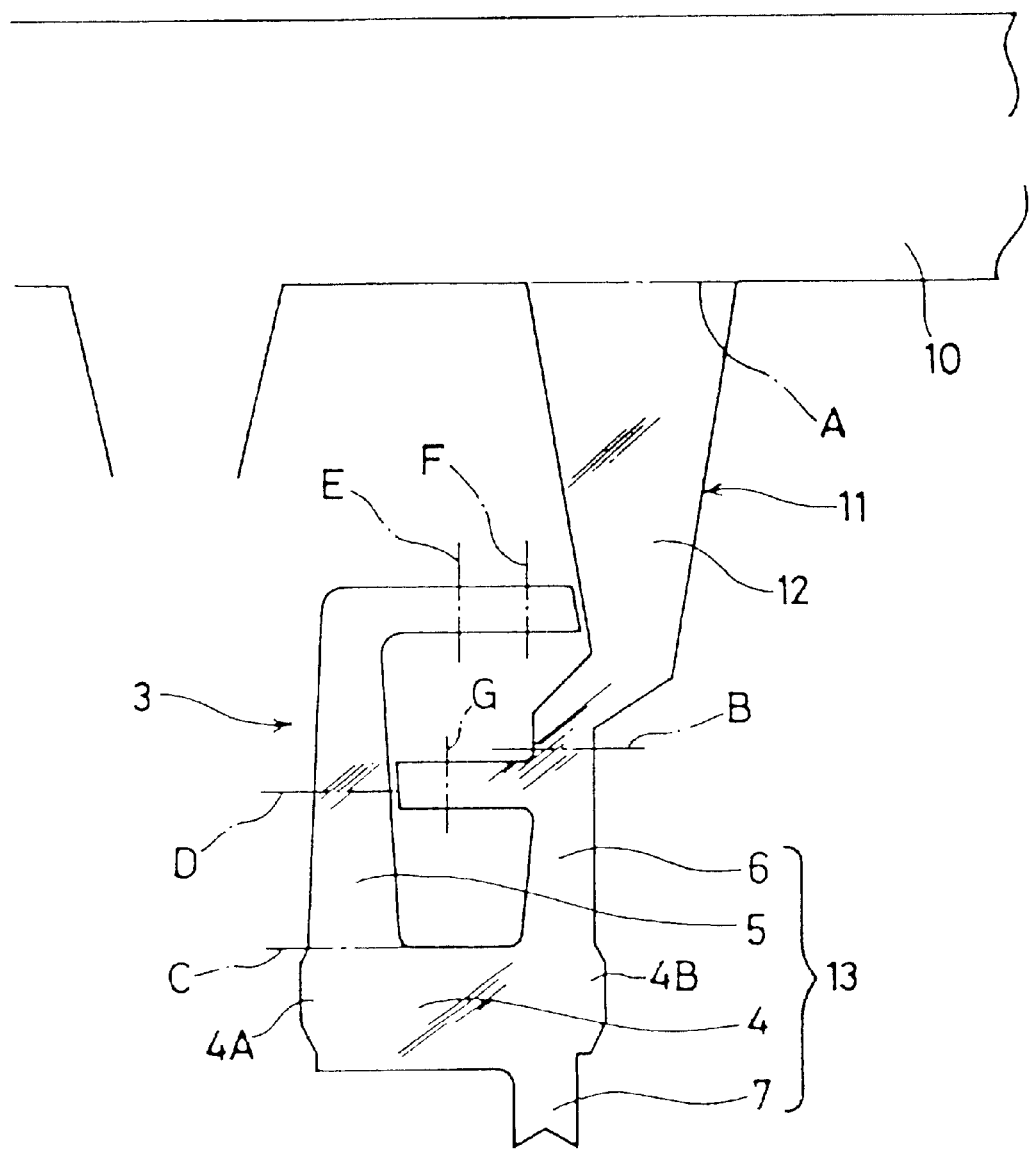
FIG. 2 is a top plan view of a contact material for a contact element.

In FIG. 2, a plurality of flat contact materials 11 linked to a carrier 10 at regular intervals are stamped out from a strip of sheet metal. The contact material 11 has a holding section 12 defined between phantom lines A and B and a remaining section 13. The holding section 12 is made wider on the side of the carrier 10 to provide holding strength. The remaining section 13 consists of the base section 4, the first and second contact pieces 5 and 6, and the connection piece 7.

The base section 4 has a flat rectangular shape with trapezoidal engaging portions 4A and 4B at opposite sides thereof. The distance between the edges of the engaging portions 4A and 4B is made slightly greater than the distance between the opposed walls of an accommodation hole 2 so that when put into an accommodation hole 2, the engaging portions 4A and 4B cut into the side wall of the accommodation hole 2 to hold the contact element 3 at a predetermined position.

The first and second contact pieces 5 and 6 extends upwardly from opposite ends of the base section 4 and are bent at right angles toward each other to phantom lines F and G, respectively. The connection section 7 extends downwardly from the base section 4 at a position close to the second contact piece 6.

Figure 3:
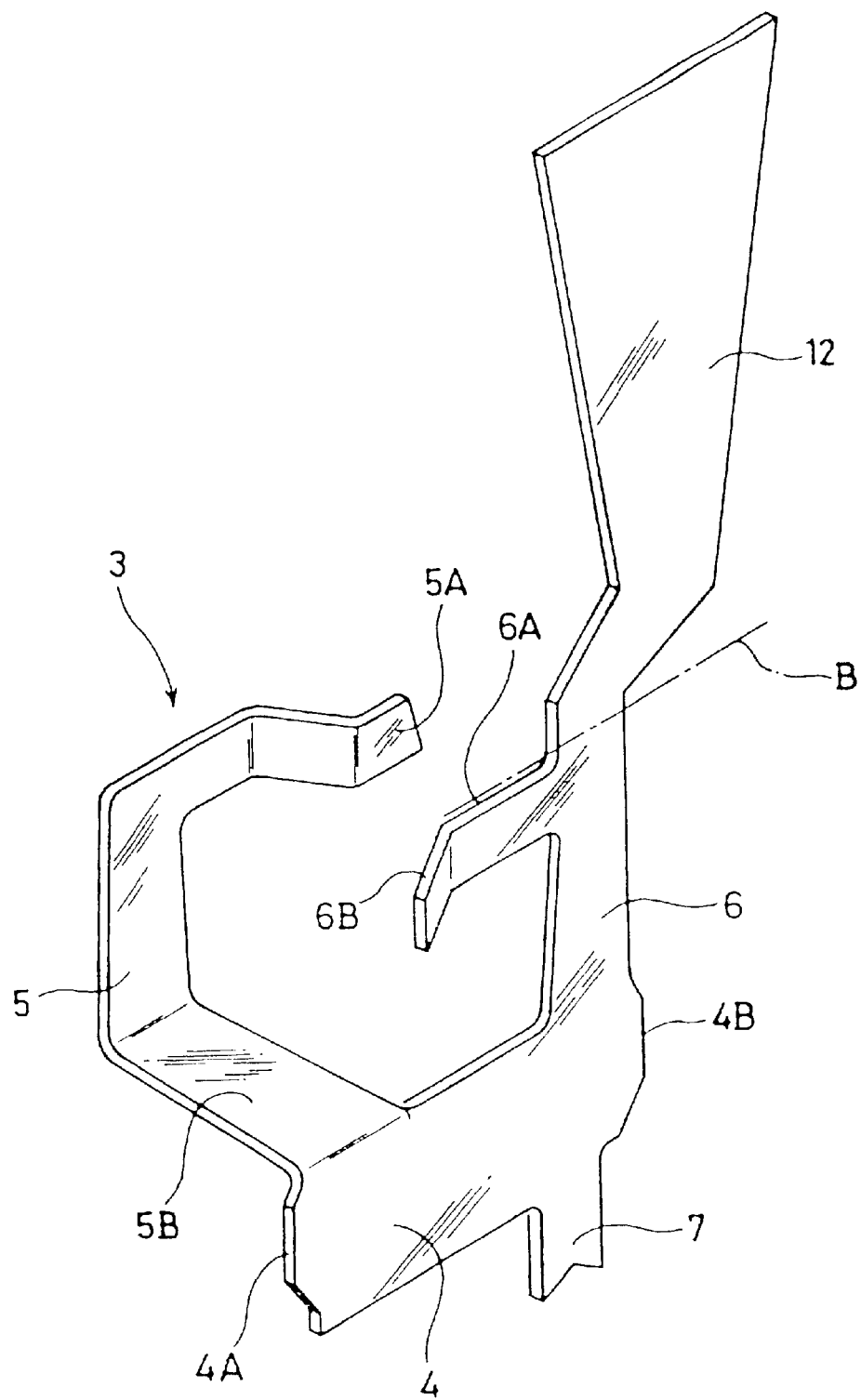
FIG. 3 is a perspective view of a contact material bent and formed into the contact element.
Figure 4:
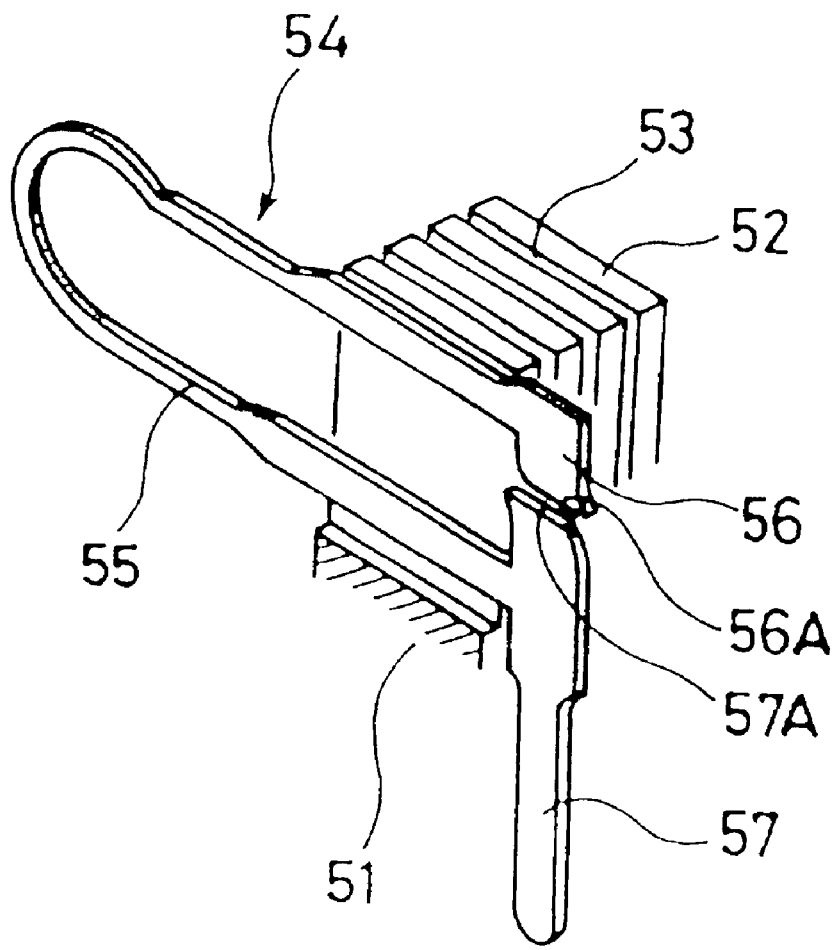
FIG. 4 is a perspective view of a conventional contact element.

In FIG. 3, the flat contact material 11 is then bent in such a form as shown in the figure. That is, the first and second contact pieces 5 and 6 are bent at positions C, D, E and F, and G, respectively, (FIG. 2). The first contact piece 5 is successively bent in three dimensions to form a contact portion 5A at the free end. More specifically, it is bent at the position C at right angles with a major surface of the base section 4, then upwardly at the position D, and then at angles at the positions E and F, respectively, to thereby provide a horizontal bearing face 5B between the positions C and D, the contact portion 5A at the free end, and a long arm portion within a small space between them which is flexible in three dimensions.

The second contact piece 6 is obliquely bent at the position G to form an introducing portion 6B which extends from a contact portion 6A which is in the same plane as the base section 4. The contact portions 6A and 5A are parallel to each other, and the distance between them is made smaller than the diameter of the terminal pin P of a mating connection object.

Then, the contact element 3 is put into the accommodation hole 2 of the housing 1 such that the connection piece 7 projects from the bottom of the housing 1. The holding section 12 is cut off at the position B before or after the contact element 3 is put in the accommodation hole 2.

Then, the connection piece 7 is connected by soldering or the like to the corresponding circuit trace of a mating connection object.

In operation, as shown in FIG. 1, the terminal P of a mating connector is put into an accommodation hole 2 with zero resistance so that the tip of the terminal P abuts against the bearing face 5B of the contact element 3 to determine the position in the insertion direction (X). Then, the mating connector is moved laterally so that the terminal P is moved in the direction Y through the introducing portion 6B of the second contact piece 6 to a position where it is held between the first and second contact portions 5A and 6A under a predetermined spring pressure. Since the first contact piece 5 is bent in three dimensions to provide a large effective length, the contact portion 5A is so resilient that the circuit traces of two connection objects are firmly connected. Since the connection piece 7 is provided close to the second contact piece 6 and there is no contact point within the contact element 3 as in the conventional connector, the electrical resistance is minimized to thereby improve the electrical characteristics.

Since the contact piece is formed in three dimensions, the contact element not only is made compact but also is very resilient. Consequently, satisfactory spring contact pressure is assured regardless of the stability of contact and the precision of work and spatial relationship. In addition, the electrical characteristics are so stable that short-circuiting the contact points of the convention connector is prevented, thereby providing a connector having low resistance and low inductance.

What is claimed is:

1. An electrical connector comprising:

a housing having at least one accommodation hole; and at least one contact element accommodated in said accommodation hole and having:

a base section;

a connection section extending downwardly from said base section and projecting from a bottom face of said housing;

a short contact piece extending upwardly from said base section at a first position and having a first contact portion at a free end thereof, said first contact portion disposed substantially in the same plane as and linked together with said connection section via a substantially straight transmission path; and a long contact piece extending from said base section at a second position, successively bent in three directions to provide flexibility in said three directions and having a second contact portion at a free end thereof, wherein said first and second contact portions press-fit a terminal of a mating connection object therebetween when said terminal is put into said accommodation hole for contact with said first and second contact portions of said contact element.

2. An electrical connector according to claim 1, wherein said long contact piece comprises a bearing face for abutment with said terminal of said mating connection object.

3. An electrical connector according to claim 2, wherein said bearing face is spaced from said contact portions in a direction at right angles with an axis of said terminal of said mating connection object.

* * * * *